United States Patent [19]
Sangyoji et al.

[11] Patent Number: 4,875,074
[45] Date of Patent: Oct. 17, 1989

[54] IMAGE RECORDING APPARATUS

[75] Inventors: Kazuo Sangyoji; Jun Sakai; Shigeyuki Hayashi; Makoto Suzuki; Yasuo Kimura, all of Nagoya, Japan

[73] Assignee: Brother Kogyo Kabushiki Kaisha, Aichi, Japan

[21] Appl. No.: 173,610

[22] Filed: Mar. 25, 1988

[30] Foreign Application Priority Data

| Apr. 1, 1987 | [JP] | Japan | 62-50566[U] |
| Apr. 6, 1987 | [JP] | Japan | 62-85176 |
| Apr. 22, 1987 | [JP] | Japan | 62-61148[U] |
| Sep. 22, 1987 | [JP] | Japan | 62-238459 |

[51] Int. Cl.$^4$ .................. G03B 27/32; G03B 27/52
[52] U.S. Cl. .................................. 355/27; 355/32; 430/138
[58] Field of Search ............... 355/26, 27, 32, 3 BE; 430/138

[56] References Cited

U.S. PATENT DOCUMENTS

| 4,218,128 | 8/1980 | Satomi et al. ............. 355/26 |
| 4,264,189 | 4/1981 | Schroeder et al. ........ 355/26 |
| 4,399,209 | 8/1983 | Sanders et al. . |
| 4,405,227 | 9/1983 | Inoue et al. ............... 355/27 |
| 4,440,846 | 4/1984 | Sanders et al. . |
| 4,697,918 | 10/1987 | Kogane ..................... 355/27 |
| 4,740,809 | 4/1988 | Yamamoto et al. ....... 355/27 |
| 4,757,332 | 7/1988 | Yuasa ........................ 355/3 BE |

Primary Examiner—Monroe H. Hayes
Attorney, Agent, or Firm—Oliff & Berridge

[57] ABSTRACT

A picture image recording apparatus includes an image-forming device for forming a light-shielding image on a light-transmissive sheet, an exposure device for exposing a photosensitive recording medium to light through the light-transmissive sheet to form a latent image corresponding to the light-shielding image on the photosensitive recording medium, and either a control device for controlling the image-forming means to form a light-shielding image on a next light-transmissive sheet area to be exposed, during exposure operation by the exposure means, or a standby device for holding the light-transmissive sheet with the image formed thereon in a standby condition. While the photosensitive recording medium is being exposed to light through the light-transmissive sheet, a next light-shielding image to be exposed can successively be formed on the light-transmissive sheet. Therefore, the time required to record picture images can be shortened.

11 Claims, 9 Drawing Sheets

IMAGE RECORDING APPARATUS

BACKGROUND OF THE INVENTION

The present invention relates to an image recording apparatus for recording an image of an original on a recording medium.

Various types of picture image recording apparatus have been developed in the art. One such picture image recording apparatus is disclosed in Japanese patent application No. 61-277595 filed Nov. 20, 1986 (corresponding to U.S. patent application No. 50,313).

In the disclosed apparatus, a print head is actuated in response to a signal indicative of image information to be recorded to impact upon an ink ribbon coated with a layer of non-light-transmissive ink for forming a light-shielding intermediate picture image on an intermediate sheet in the form of a light-transmissive sheet. Light is applied to the side of the intermediate sheet on which the light-shielding image is present, and passed through the intermediate sheet to expose a photo-sensitive pressure-sensitive recording sheet used as a photosensitive recording medium, to the image. The time required to form the intermediate image on the intermediate sheet in the above apparatus is shorter than the time required by earlier picture image recording apparatus to form light-shielding images of respective colors on an intermediate sheet through an electrophotographic process or a thermal transfer process. The apparatus disclosed in the above application is also small in size and requires easy maintenance only.

When exposing the photosensitive pressure-sensitive recording sheet to the image, it is necessary to hold the photosensitive pressure-sensitive recording sheet and the intermediate sheet at rest in superposed relation in order to prevent the image formed on the photosensitive pressure-sensitive recording sheet from being shifted out of registry. To meet this requirement, the formation of the light-shielding image on the intermediate sheet has to be interrupted temporarily. Therefore, light-shielding images cannot be successively formed on the intermediate sheet, and the period of time until a final picture image is recorded cannot be reduced.

The aforesaid problem manifests itself when respective light-shielding images of colors that make up a color picture image are formed on an intermediate sheet. The rate of speed at which such a color picture image is formed is thus low.

Figure 1:
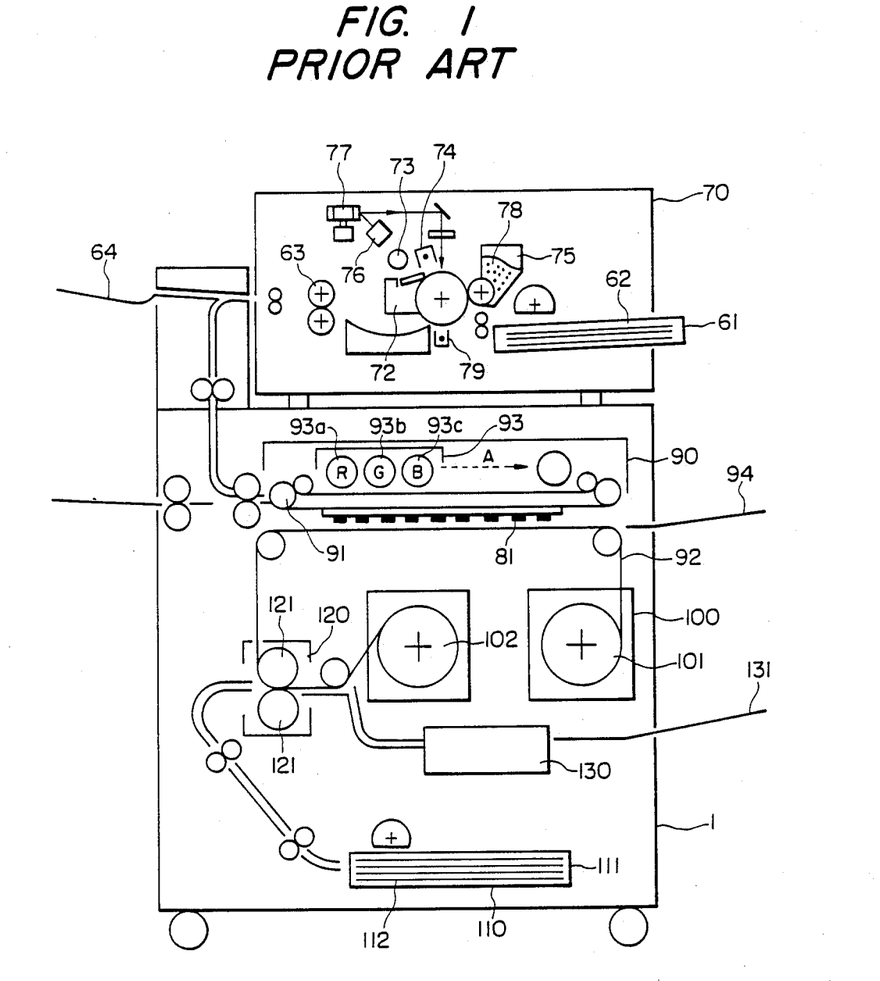
FIG. 1 is a schematic elevational view of a conventional picture image recording apparatus.

FIG. 1 of the accompanying drawings illustrates another conventional color picture image recording apparatus. The illustrated apparatus includes a laser printer 70 serving as an intermediate image generator for forming intermediate images of three separated colors such as cyan, magenta, and yellow on intermediate sheets 62 serving as light-transmissive mediums. The intermediate images of separated colors are then formed on photomask plates 81 (hereinafter referred to as "mask members") based on the color picture image information. The mask members 81 are then brought into intimate contact with a photosensitive pressure-sensitive recording sheet 92 as a color photosensitive pressure-sensitive recording medium. Then, a red-light lamp 93a is energized for the cyan mask member, a green-light lamp 93b is energized for the magenta mask member, and a blue-light lamp 93c is energized for the yellow mask member, to expose the photosensitive pressure-sensitive recording sheet 92, thereby forming a latent image thereon. The photosensitive pressure-sensitive recording sheet 92 is of the image transfer type. After exposure, the photosensitive pressure-sensitive recording sheet 92 is superposed on a color developer sheet 112 supplied from a color developer sheet cassette 111. The superposed sheets 92, 112 are then fed between two pressure developing rollers 121 to develop the latent image into a color picture image on the color developer sheet 112, which is thereafter discharged onto a tray 131.

The time required to expose the photosensitive pressure-sensitive recording sheet 92 in intimate contact with the mask members 81 is longer than the time required to form one mask member with the laser printer 70. Therefore, the laser printer 70 must refrain from forming a next mask member until the exposure of the photosensitive pressure-sensitive recording sheet 92 to the mask members 81 is finished. Stated otherwise, the formation of a light-shielding image on an intermediate sheet has to be interrupted temporarily. Therefore, light-shielding images cannot successively be formed on the intermediate sheet, and the period of time until a final picture image is recorded cannot be reduced.

Image information may be recorded on a photo-sensitive pressure-sensitive recording sheet in different ways. For example, image information may be scanned and exposed directly to a photosensitive pressure-sensitive recording sheet by using switchable light such as a laser beam. Alternatively, light information may be written on a photosensitive pressure-sensitive recording sheet with a microshutter such as by disposing a liquid crystal light shutter between the sheet and a continuously energized lamp. These methods however have the following problems:

With respect to the former method, photosensitive pressure-sensitive recording sheets that are presently manufactured have spectral sensitivities below a wavelength $\lambda = 475$ nm. Therefore, the laser beam source for scanning and exposing the sheets should be an argon laser beam source (wavelength $\lambda = 351$ nm), a krypton laser beam source (wavelength $\lambda = 351$ nm), a helium-cadmium laser beam source (wavelength $\lambda = 325$ nm), or an ultraviolet gas laser. These laser devices are however large in size and expensive.

As regards the latter method, where a liquid crystal light shutter is employed as the microshutter, the liquid crystal itself is deteriorated by ultraviolet radiation.

A picture image recording apparatus designed to eliminate the aforesaid difficulties is disclosed in Japanese Kokai Publication No. 62-231965 (corresponding to U.S. patent application No. 32865).

In the disclosed picture image recording apparatus, a latent image corresponding to a picture image on an original is formed on a transparent photosensitive body as a latent image carrier and a light-shielding material is coated on the latent image. A photosensitive pressure-sensitive sheet and an exposure device are disposed one on each side of the transparent photosensitive body, and the sheet is exposed to light from the exposure device through the light-shielding material and the transparent photosensitive body.

The sheet carries a multiplicity of microcapsules on its surface. The microcapsules can be hardened by exposure to light, but remain soft unless exposed to light. The microcapsules as hardened by exposure to light are not ruptured when pressure is applied to the sheet. Those microcapsules which are soft because light is prevented from being applied thereto by the light-shielding material are however ruptured by such pressure. The recording sheet therefore develops color by a coloring agent contained in the microcapsules. Therefore, a picture image corresponding to the latent image on the transparent photosensitive body is formed on the sheet. The developed picture image is identical to the picture image on the original. Thus, the picture image on the original is duplicated.

The picture image recording apparatus described above is free from the problems of the conventional apparatus using a photosensitive pressure-sensitive sheet, i.e., large size of the exposure scanning means and deterioration of the microshutter.

However, the above picture image recording apparatus is still disadvantageous in that since a drum-shaped photosensitive body and toner are employed, the apparatus is complex in structure, large in size, expensive to manufacture, and requires a high running cost due to maintenance of the photosensitive body and other components.

Further, U.S. Pat. No. 4,399,209 discloses a transfer type recording medium in which a developer material is coated on a separate substrate as a separate developer or copy sheet. Furthermore, U.S. Pat. No. 4,440,846 discloses a self-contained type recording medium in which an encapsulated chromogenic material or dye precursor and a developer material are codeposited on one surface of a single substrate as one layer or as two contiguous layers.

SUMMARY OF THE INVENTION

In view of the aforesaid drawbacks of the conventional picture image recording apparatus, it is an object of the present invention to provide an image recording apparatus which solves the problem of a prior art apparatus shown in FIG. 1 that an intermediate image as light shielding image cannot be formed on an intermediate sheet as a light-transmissive sheet during exposure, which can shorten the time required to form an intermediate image on an intermediate sheet, and which can reduce the time required until a final image is recorded, so that the picture image recording apparatus has a high recording speed.

Another object of the present invention is to provide a picture image recording apparatus in which light-shielding images can successively be formed on an intermediate sheet, which may be continuous or of a cut form, by forming a light-shielding image on the intermediate sheet behind an intermediate image of color picture image information then in an exposure process, when a next color image information signal is applied.

Still another object of the present invention is to provide a picture image recording apparatus which is made simple in structure, small in size, inexpensive to manufacture, and easy to maintain through the elimination of a drum-shaped photosensitive body and toner.

According to one aspect of the present invention, the above objects can be accomplished by a picture image recording apparatus including an image-forming means for forming a light-shielding image on a light-transmissive sheet, an exposure means for exposing a photosensitive recording medium to light through the light-transmissive sheet to form a latent image corresponding to the light-shielding image on the photosensitive recording medium, and either a control means for controlling the image-forming means to form a light-shielding image on a next light-transmissive sheet area to be exposed, during exposure operation by the exposure means, or a standby means for holding the light-transmissive sheet with the light shielding image formed thereon in a standby condition. With the above arrangement, while the photosensitive recording medium is being exposed to light through the light-transmissive sheet, a next light-shielding image to be exposed can successively be formed on the light-transmissive sheet. Therefore, the time required to record picture images can be shortened.

According to another aspect of the present invention, there is provided a picture image recording apparatus including an input device for entering color image data from an original, a mask member forming means for dividing and recording the color image data respectively on thermosensitive recording sheets thereby to produce mask members, respectively, an exposure means for exposing a photosensitive pressure-sensitive recording sheet coated with coloring materials to light through the mask members, and a pressing means for pressing the exposed photosensitive pressure-sensitive recording sheet to develop an image. The image of the original is recorded on the thermosensitive recording sheets by the mask member forming means, and the formed mask members are intimately held against the photosensitive pressure-sensitive recording sheet. Therefore, the apparatus is simple in construction, and requires easy maintenance only as no photosensitive body is emloyed. Thus, the running cost of the apparatus is low, and the apparatus is inexpensive to manufacture.

According to still another aspect of the present invention, a picture image recording apparatus includes a placing means for feeding the photosensitive pressure-sensitive sheet in a direction transverse to the direction in which the mask members are fed and for placing the photosensitive pressure-sensitive sheet in intimate contact with the mask members. Feed rollers for feeding the mask members and feed rollers for feeding the photosensitive pressure-sensitive sheet are not positioned in superposed relation. Thus, the apparatus is small in size.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

FIGS. 2 through 5 show a color picture image recording apparatus for recording a color picture image according to a first embodiment of the present invention.

Figure 2:
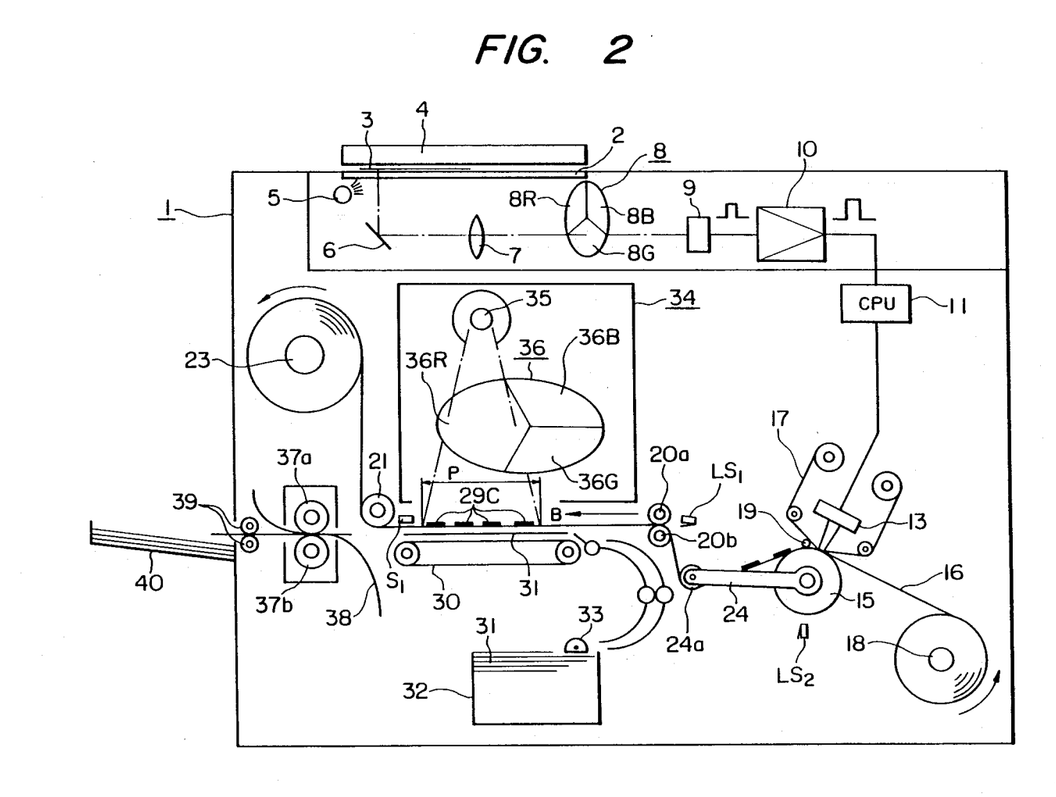
FIG. 2 is a schematic elevational view of a picture image recording apparatus according to a first embodiment of the present invention.

As illustrated in FIG. 2, the color picture image recording apparatus includes a main body or housing 1 having an original support table 2 made of transparent glass disposed on an upper panel thereof. An original 3 to be copied or recorded is placed on the original support table 2, and then covered with an original cover 4. A light source lamp 5 is disposed beneath the original support table 2 for emitting light to scan the lower surface of the original 3. Light reflected from the scanned original 3 is passed through an optical system comprising a reflecting mirror 6, a focusing lens 7, a trichromatic color separation filter 8, and a CCD 9 serving as a color image sensor. The trichromatic color separation filter 8 comprises a red filter 8R for passing red light only, a green filter 8G for passing green light only, and a blue filter 8B for passing blue light only.

Figure 3:
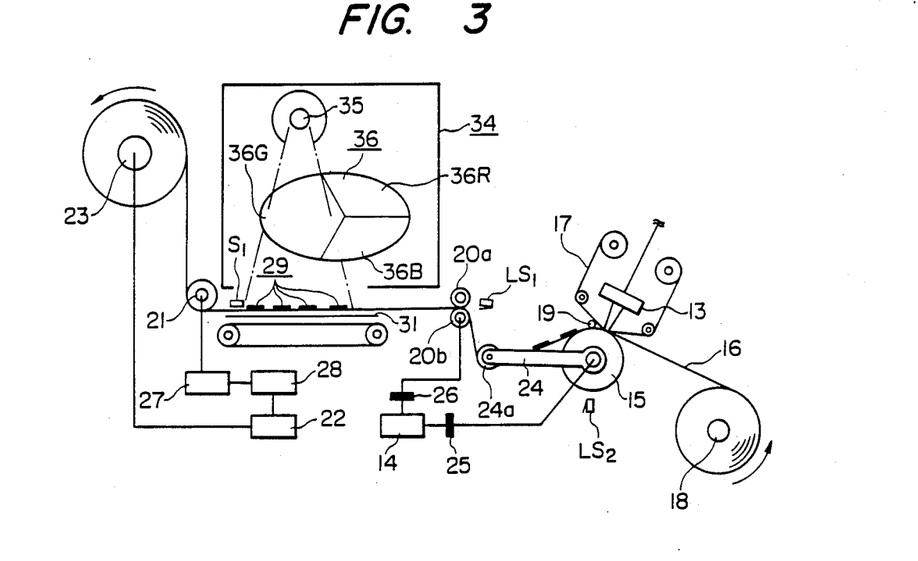
FIG. 3 is an enlarged view of a portion of the picture image recording apparatus.
Figure 4:
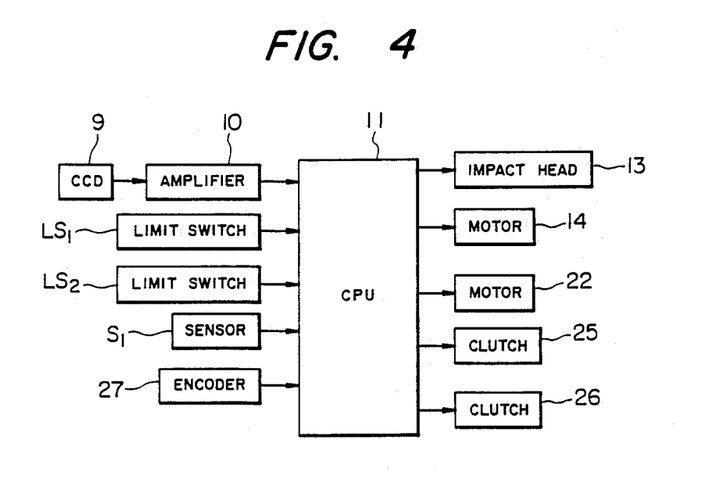
FIG. 4 is a block diagram of an electric system of the picture image recording apparatus.

As shown in FIGS. 2 through 4, the CCD 9 is electrically connected to an impact head 13 comprising a wire-dot-matrix print head through an amplifier 10 and a control means 11 comprising a CPU. The impact head 13 is disposed in confronting relation to a platen 15 rotated about its own axis by a motor 14. Between the platen 15 and the impact head 13, there are disposed an ink ribbon 17 and an intermediate sheet 16 in the form of a light-transmissive sheet comprising a continuous light-transmissive sheet of resin film or paper, the ink ribbon 17 and the intermediate sheet 16 being superposed on each other. The intermediate sheet 16 is unwound from a supply roll 18 and fed between the platen 15, the impact head 13, and a pressing roller 19. The intermediate sheet 16 is then fed horizontally between a pair of feed rollers 20a, 20b rotated by the motor 14, and then guided by a guide roller 21 and wound around a takeup roll 23 rotated by a motor 22. A tension arm 24 has one end angularly movably supported coaxially on the platen 15 and supports a pair of rollers 24a on its distal end. The rollers 24a engage opposite transverse edges of the intermediate sheet 16 to tension the sheet 16 as it travels from the pressing roller 19 to the feed rollers 20a, 20b, due to the gravity of the arm 24 and the rollers 24a. As shown in FIG. 3, the platen 15 and the feed rollers 20a, 20b are operatively coupled to the motor 14 through respective clutches 25, 26. Therefore, the platen 15 and the feed rollers 20a, 20b can independently be rotated by engaging and disengaging the clutches 25, 26 selectively. The guide roller 21 is coupled to an encoder 27 which detects the distance that the intermediate sheet 16 has moved, based on the amount of rotation of the guide roller 21. The motor 22 is controlled by a controller 28 based on a signal from the encoder 27 thereby controlling the length of the intermediate sheet 16 which is wound on the takeup roll 23. The impact head 13, the platen 15, and the ink ribbon 17 jointly constitute an image forming means for forming a light-shielding image 29 on the intermediate sheet 16.

Adjacent to the feed rollers 20a, 20b and below the platen 15, there are disposed limit switches $LS_1$, $LS_2$ which can be triggered by contract with a transverse edge of the intermediate sheet 16.

An exposure table 30 in the form of a roller conveyor is disposed along and below the intermediate sheet 16 as it travels from the feed rollers 20a, 20b to the guide roller 21. A sheet cassette 32 storing therein a stack of photosensitive pressure-sensitive recording sheets 31 serving as photosensitive recording mediums is located below the exposure table 30. One of the photosensitive pressure-sensitive recording sheets 31 is supplied, at a time, onto the exposure table 30 by a sheet feed roller 33. In the illustrated embodiment, each of the photosensitive pressure-sensitive recording sheets 31 is capable of duplicating a color picture image thereon. Each sheet 31 is coated on its surface with a layer comprising cyan microcapsules encapsulating a cyan dye precursor as a main component, a photo-setting resin, a photosensitizer, a photopolymerization starter, and the like, magenta microcapsules encapsulating a magenta dye precursor as a main component, a photo-setting resin, a photosensitizer, a photopolymerization starter, and the like, and yellow microcapsules encapsulating a yellow dye precursor as a main component, a photo-setting resin, a photosensitizer, a photopolymerization starter, and the like, these microcapsules being uniformly mixed and dispersed.

An exposure device 34 is disposed as an exposure means directly above the exposure table 30 with the intermediate sheet 16 interposed therebetween. The exposure device 34 has an exposure lamp 35 serving as a light source for emitting white light such as a fluorescent lamp, a halogen lamp, or the like, and a trichromatic color separation filter 36 disposed in the path of light emitted from the exposure lamp 35. The trichromatic color separation filter 36 comprises a red filter 36R for passing only light of a wavelength (650 nm in the present embodiment) for photosetting the cyan microcapsules, a green filter 36G for passing only light of a wavelength (550 nm in the present embodiment) for photo-setting the magenta microcapsules, and a blue green filter 36B for passing only light of a wavelength (450 nm in the present embodiment) for photosetting the green microcapsules, these filters corresponding to the spectral sensitivities of the microcapsules containing the cyan, magenta, and yellow dye precursors coated on the photosensitive pressure-sensitive recording sheet 31. With a selected one of the filters 36R, 36G, 36B disposed in the light path, light is applied by the exposure lamp 35 to the intermediate sheet 16 on the side thereof on which the light-shielding image 29 is present, the light being of such an intensity as to be able to optically sensitize the photosensitive pressure-sensitive sheet 31. More specifically, only those microcapsules of the corresponding color in an illuminated area of the sheet 31 except the area to which no light is applied due to the light-shielding image 29 are hardened or photoset. In this manner, latent images corresponding to the three colors are successively formed on the photosensitive pressure-sensitive sheet 31.

A sensor $S_1$ is disposed near the guide roller 21 in close contact with the upper surface of the intermediate sheet 16 for reading a positioning mark (not shown) impressed on the intermediate sheet 16 when the light-shielding image 29 is formed.

A pair of pressure developing rollers 37a, 37b serving as a developing means is positioned in the vicinity of the downstream end of the exposure table 30. The photosensitive pressure-sensitive sheet 31 that has been exposed to light on the exposure table 30 and fed by the exposure table 30, and a color developer sheet 38 supplied from a separate source are delivered in superposed relation between the pressure developing rollers 37a, 37b. The color developer sheet 38 is coated with a layer containing color developers which can develop colors in reaction with the dye precursors contained in the microcapsules on the photosensitive pressure-sensitive sheet 31. By pressure-feeding the photosensitive pressure-sensitive sheet 31 and the color developer sheet 38 between the pressure developing rollers 37a, 37b, those microcapsules which are not photoset on the sheet 31 are pressure-ruptured to allow the dye precursors to flow out which then react with the color devleopers on the color developer sheet 38, whereupon the trichromatic latent images on the sheet 31 are developed into a picture image on the color developer sheet 38. The color developer sheet 38 on which the picture image has been formed is discharged onto a tray 40 by a pair of discharge rollers 39.

A process for forming a color picture image in the picture image recording apparatus thus constructed will be described below.

As shown in FIG. 2, the light source lamp 5 is first energized to scan the surface of the original 3 with light from the light source lamp 5. Reflected scanning light is reflected by the reflecting mirror 6 and focused on the CCD 9 by the focusing lens 7 and the trichromatic color separation filter 8. Images, such as characters, a picture, or the like on the original 3, having colors having passed through the filters 8R, 8G, 8B are now successively read as light intensities by the CCD 9. The image information read by the CCD 9 is converted into an electric signal which is amplified by the amplifier 10. The amplified signal is then fed to the CPU 11 which controls the operation of the impact head 13 to print non-light-transmissive ink from the ink ribbon 17 on the intermediate sheet 16 in an area where no light is sensed by the CCD 9, thereby forming a light-shielding image 29.

Light-shielding images 29 are successively formed on the intermediate sheet 16 in the order of cyan, magenta, and yellow. More specifically, while the intermediate sheet 16 is being fed in the direction of the arrow B in FIG. 2 by being wound by the takeup roll 23, the trichromatic color separation filter 8 is angularly moved to bring the red filter 8R, then the green filter 8G, and finally the blue filter 8B successively into the light path. Each time the filter is changed, scanning light is emitted from the light source lamp 5. When the red filter 8R, for example, is in the light path, only image data of red light, i.e., magenta and yellow, reflected from the original 3 is allowed to pass through the red filter 8R and be read by the CCD 9. On the intermediate sheet 16, a positive image 29C is formed by printing non-light-transmissive ink in the area other than magenta and yellow images, i.e., the area containing a cyan image.

Figures 5A, 5B:
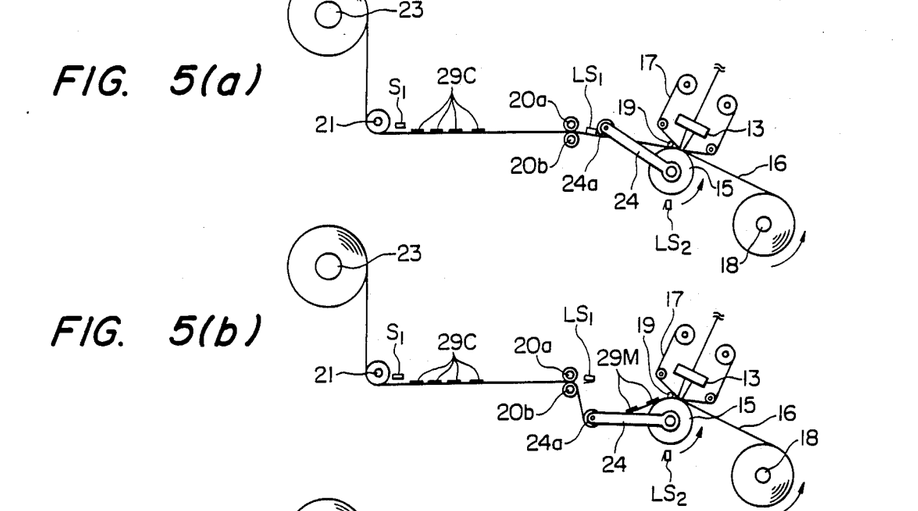
FIGS. 5(a) through 5(d) are schematic views showing a process of forming a light-shielding image on an intermediate sheet.

As shown in FIG. 5(a), the positive image 29C is then fed into an exposure area P (FIG. 2) by the takeup roller 23, the feed rollers 20a, 20b, and the platen 15 which are driven in timed relation. When the sensor $S_1$ reads a positioning mark (not shown) on the intermediate sheet 16, the takeup roll 23 and the feed rollers 20a, 20b are stopped to position the positive image 29C in facing relation to the exposure device 34.

Then, the photosensitive pressure-sensitive sheet 31 supplied to the sheet cassette 32 onto the exposure table 30 is exposed to light through the intermediate sheet 16. More specifically, the red filter 36R for cyan is selected and placed in the light path in the exposure device 34, and the photosensitive pressure-sensitive sheet 31 is exposed to light through the light-shielding image 29C on the intermediate sheet 16. Therefore, those cyan microcapsules in the area on the sheet 31 which is not exposed to light due to the light-shielding image 29C, i.e., which has not been exposed to the red light from the original 3, are not photo-set, whereas those cyan microcapsules in the area which is exposed to light, i.e., which has been exposed to the red light from the original 3, are photo-set, whereupon a cyan latent image is formed on the photosensitive pressure-sensitive sheet 31.

Figures 5C, 5D:
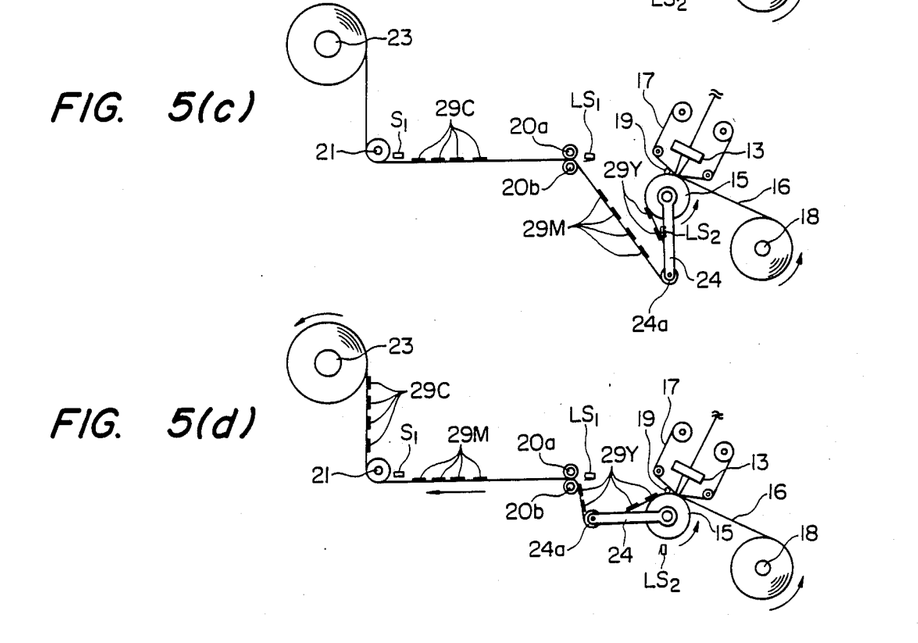

As illustrated in FIG. 5(b), while the sheet 31 is being exposed to form the cyan latent image, the impact head 13 continues to form positive images on the intermediate sheet 16. With the green filter 8G set in the light path, only image data of green light, i.e., cyan and yellow, reflected from the original 3 is allowed to pass through the green filter 8G and read by the CCD 9. On the intermediate sheet 16, a positive image 29M is formed by printing non-light-transmissive ink in the area containing a magenta image. Similarly, with the blue filter 8B set in the light path, only image data of blue light, i.e., magenta and cyan, reflected from the original 3 is allowed to pass through the blue filter 8B and read by the CCD 9. On the intermediate sheet 16, a positive image 29Y is formed by printing non-light-transmissiive ink in the area containing a yellow image. As shown in FIGS. 5(b) and 5(c), the positive images 29M, 29Y are successively formed on the single intermediate sheet 16 following the cyan positive image 29C. Though the intermediate sheet 16 is delivered toward the exposure device 34 by the platen 15 and the pressing roller 19, it is forcibly directed downwardly or caused to depend by the tension arm 24 between the pressing roller 19 and the feed rollers 20a, 20b since the feed rollers 20a, 20b are stopped.

When the formation of the positive images 29M, 29Y of magenta and yellow is completed during exposure to the positive image 29C of cyan, or the tension arm 24 is moved downwardly to its lowest position and the limit switch $LS_2$ is triggered by contact with the intermediate sheet 16, as shown in FIG. 5(c), the CPU 11 de-energizes the impact head 13 to stop the formation of the light-shielding image 29, and at the same time disengages the clutch 25 to stop the rotation of the platen 15.

When the exposure to the cyan positive image 29C is over, the CPU 11 energizes the motor 22 to enable the takeup roll 23 to wind the intermediate sheet 16 and engages the clutch 26 to rotate the feed rollers 20a, 20b with the motor 14 until the magenta positive image 29M is positioned in confronting relation to the exposure device 34. The speed of travel of the intermediate sheet 16 fed by the motors 22, 14 is higher than the speed of rotation of the platen 15 at the time of forming the light-shielding image 29, so that the intermediate sheet 16 can quickly be located into the exposure position. In the exposure device 34, light is applied while the filter 36G for magenta is being selected, to form a magenta latent image on the photosensitive pressure-sensitive recording sheet 31. After the exposure of the magenta positive image 29M, the yellow positive image 29Y on the intermediate sheet 16 is disposed in facing relation to the exposure device 34, and while the filter 36B for yellow is being selected, light is applied to form a yellow latent image on the photosensitive pressure-sensitive recording sheet 31.

When the exposure to the cyan positive image 29C is finished during the formation of the magenta or yellow positive image 29M or 29Y on the intermediate film 16, the motor 22 is energized to rotate the takeup roll 23 at a speed higher than the speed at which the intermediate sheet 16 is fed by the platen 15. Then, the clutch 26 is engaged to rotate the feed rollers 20a, 20b to position the next positive image 29M on the intermediate sheet 16 in confronting relation to the exposure device 34.

The photosensitive pressure-sensitive sheet 31, after the latent images of the respective colors have been formed thereon, is fed by the exposure table 30 and superposed on a color developer sheet 38 supplied from the separate source. The sheets 31, 38 are delivered between the pressure developing rollers 37a, 37b, and pressed thereby. Those microcapsules of the respective colors on the photosensitive pressure-sensitive sheet 31 which are not photo-set are ruptured bo permit the dye precursors to flow out and react with the color developers on the color developer to develop the trichromatic latent images on the sheet 31 into a color picture image on the color developer sheet 38. More specifically, the magenta and yellow microcapsules are ruptured in the area in which only the cyan microcapsules are photo-set, i.e., the area which is exposed to red light reflected from the original 3, to cause the magenta and yellow due precursors to develop red color through a subtractive color mixture. The yellow and cyan microcapsules are ruptured in the area in which only the magenta microcapsules are photo-set, i.e., the area which is exposed to green light reflected from the original 3, to cause the yellow and cyan dye precursors to develop green color through a subtractive color mixture. Likewise, the magenta and cyan microcapsules are ruptured in the area in which only the yellow microcapsules are photo-set, i.e., the area which is exposed to blue light reflected from the original 3, to cause the magenta and cyan dye precursors to develop blue color through a subtractive color mixture. Where the characters or picture on the original 3 is black in color, since red, green, and blue light is not reflected from the black area, no light is passed through the red filter 8R, the green filter 8G, and the blue filter 8B, and any cyan, magenta, and yellow microcapsules on the photosensitive pressure-sensitive recording sheet 31 are not photo-set. Therefore, the cyan, magenta, and yellow microcapsules are ruptured to permit the cyan, magenta, and yellow dye precursors to produce black characters or picture image through a subtractive color mixture on the photosensitive pressure-sensitive recording sheet 31.

If the same original is to be recorded or copied on a plurality of photosensitive pressure-sensitive recording sheets 31, the takeup roll 23 is reversed clockwise (FIG. 2) while the platen 15 is being held at rest, and the feed rollers 20a, 20b are reversed counterclockwise to position the cyan positive image 29C again in confronting relation to the exposure device 34. The magenta and yellow positive images 29M, 29Y are now caused to depend again between the feed rollers 20a, 20b and the pressing roller 19. Then, a photosensitive pressuresensitive sheet 31 is exposed to the cyan positive image 29C. The positive images 29M, 29Y are successively brought into facing relation to the exposure device 34 for exposure. Therefore, the positive images 29C, 29M, 29Y can repeatedly be used for image recording or reproduction.

In the picture image recording apparatus of the above embodiment, light-shielding images 29 of respective colors are formed on the intermediate sheet 16 by the impact head 13, and while the photosensitive pressure-sensitive sheet 31 is being exposed to the formed light-shielding images 29, other light-shielding images 29 are successively formed on the intermediate sheet 16 by exposure to light from the original 3. Accordingly, unlike the conventional picture image recording apparatus, it is not necessary to stop the formation of light-shielding images 29 on the intermediate sheet 16 during exposure of the photosensitive pressure-sensitive sheet 31. The speed of recording or copying images is thus increased.

Modifications of the above first embodiment will be described below.

Figure 6:
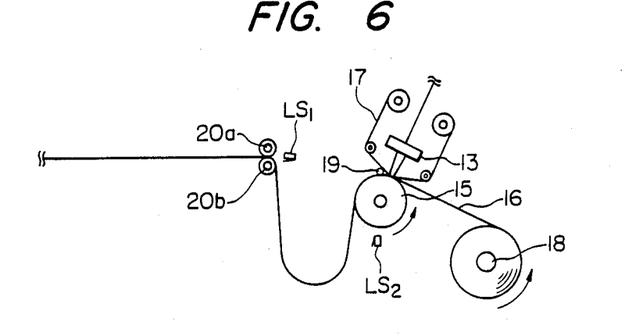
FIGS. 6 through 8 are schematic views showing modifications of the first embodiment.

As shown in FIG. 6, a gap is left between the pressing roller 19 and the feed rollers 20a, 20b to allow the intermediate sheet 16 to depend in the gap by gravity.

Figure 7:
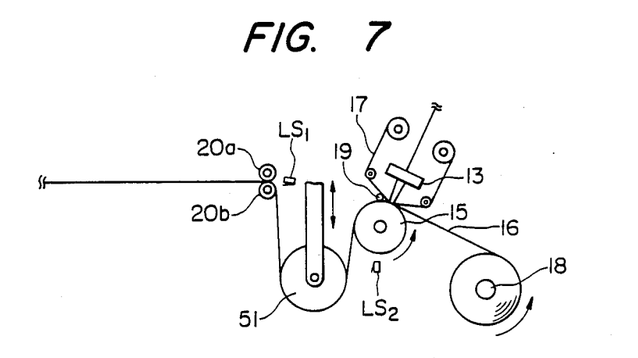

In another modification of FIG. 7, a pinch roll 51 is disposed between the pressing roller 19 and the feed rollers 20a, 20b in engagement with the intermediate sheet 16, the pinch roll 51 being vertically movable to force the intermediate sheet 16 to depend between the pressing roller 19 and the feed rollers 20a 20b.

Figure 8:
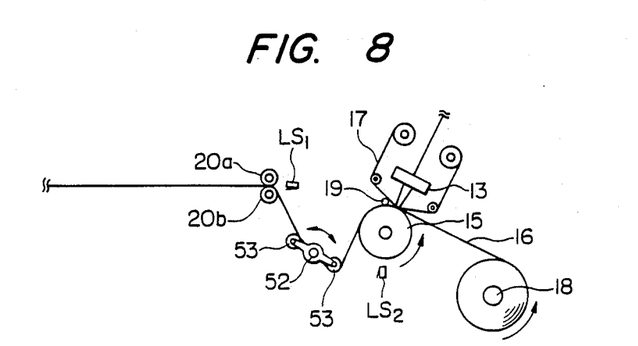

FIG. 8 shows still another modification in which a pair of planet rolls 53 is angularly movably mounted on a shaft 52 between the pressing roller 19 and the feed rollers 20a, 20b in engagement with the intermediate sheet 16, for causing the intermediate sheet 16 to depend between the pressing roller 19 and the feed rollers 20a, 20b.

The light-shielding images 29 may be formed on the intermediate sheet 16 by xerography, magnetography, thermomagnetography, or other suitable imaging processes.

According to the first embodiment of the present invention, as described above, while a photosensitive pressure-sensitive recording medium is being exposed to light through a light-transmissive sheet bearing a light-shielding image, a next light-shielding image can successively be formed on the light-transmissive sheet. Thus, the time required for recording images can be reduced.

A color picture image recording apparatus according to a second embodiment will be described with reference to FIG. 9.

According to the second embodiment, a plurality of intermediate light-transmissive sheets 62 of elongate rectangular shape cut to predetermined dimensions are employed, and an intermediate sheet 62 with light-shielding images of separated colors serves as a photomask plate which will be referred to as a mask member 81.

Figure 9:
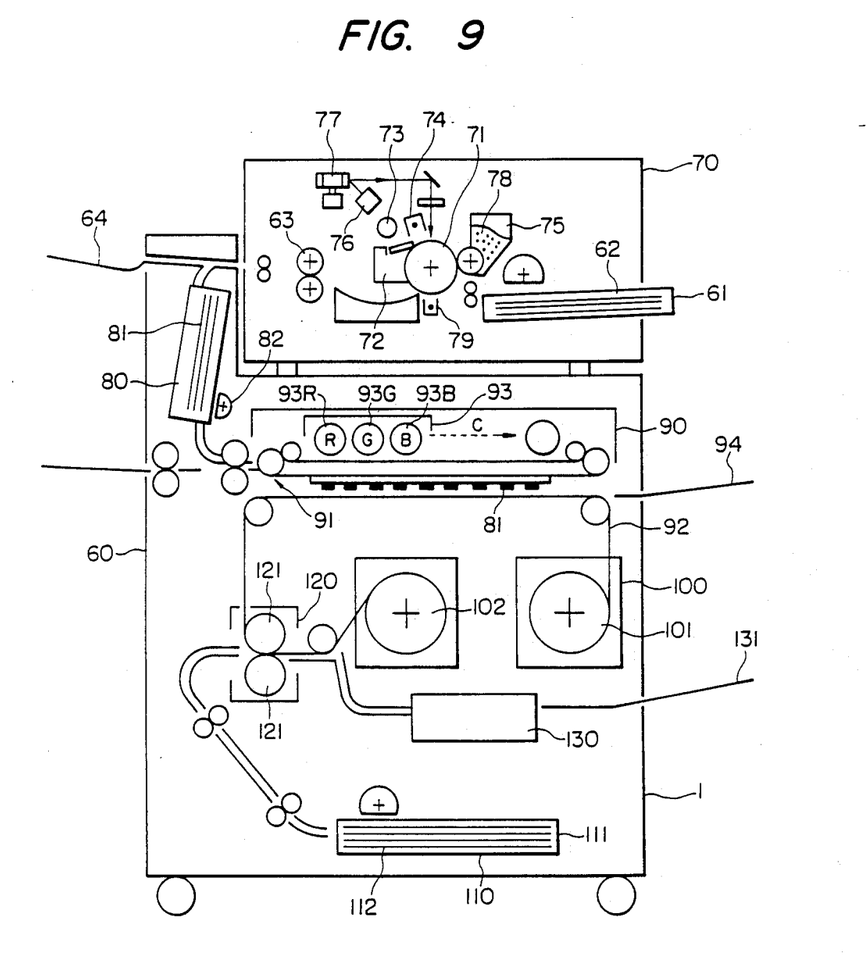
FIG. 9 is a schematic elevational view of a picture image recording apparatus according to a second embodiment of the present invention.

As shown in FIG. 9, the picture image recording apparatus includes a main body or housing 1 housing therein a laser printer 70 for forming an optical latent image on a photosensitive drum 71 based on image information to be recorded, a cassette 80 for storing mask members 81 with visible images developed from optical latent images on the photosensitive drum 71, an exposure unit 90 for exposing a photosensitive pressure-sensitive recording sheet 92 to light through a mask member 81, a feeding unit 100 for feeding the photosensitive pressure-sensitive recording sheet 92, a supply unit 110 for supplying a color developer sheet 111, a pressure developing unit 120 for developing an image under pressure while keeping the photosensitive pressure-sensitive sheet 92 and the color developer sheet 111 in superposed relation, and a thermal fixing unit 130 for fixing the developed image on the color developer sheet 112 and giving a glossy appearance to the sheet 112.

The laser printer 70 as a mask member forming means has a cleaning device 72, a charge eraser 73, a charger 74, a developing device 75 containing toner, and a transfer device 79, all arranged around the photosensitive drum 71 serving as a latent image carrier. A semiconductor laser 76 and a polygonal mirror scanner 77 for deflecting a laser beam from the semiconductor laser 76 are provided for transferring image information as a latent image on the photosensitive drum 71. As the photosensitive drum 71 is rotated about its own axis, it is uniformly charged by the charger 74, and a laser beam emitted from the semiconductor laser 76 based on image information to be recorded is applied to the photosensitive drum 71 to form a latent image thereon. Then, toner 78 is supplied from the developing device 75 and applied to the photosensitive drum 71 to develop the latent image into a visible image The toner image on the photosensitive drum 71 is thereafter transferred onto an intermediate sheet 62 of plain paper supplied from an intermediate sheet cassette 61. The toner image on the intermediate sheet 62 is fixed by the thermal fixing device 130 to produce a mask member 81, which will temporarily be stored in the mask member cassette 80 serving as a standby means. The mask members 81 stored in the cassette 80 are fed, one at a time, to the exposure unit 90 by a feed roller 82.

The exposure unit 90 comprises a feed belt 91 for feeding a mask member 81 to a prescribed exposure position, the feed belt 91 being capable of passing light sufficiently therethrough, a positioning means (not shown) for positioning the mask member 81 and the photosensitive pressure-sensitive sheet 92 in a given location, a contacting means (not shown) for bringing the positioned mask member 81 and photosensitive pressure-sensitive sheet 92 in intimate contact with each other, a light source lamp unit 93 composed of fluorescent lamps for emitting red, green, and blue lights for exposure, and a driving means (not shown) for moving the light source lamp unit 93 in the direction of the arrow C.

The feeding unit 100 includes a sheet cassette 101 for supplying the photosensitive pressure-sensitive recording sheet 92 to the exposure position in the exposure unit 90 and a takeup roll 102 having a driving means (not shown) for winding the photosensitive pressure-sensitive recording sheet 92 after having been exposed.

The pressure developing unit 120 serving as a developing means feeds the photosensitive pressure-sensitive recording sheet 92 which has been exposed and a color developer sheet 112 fed from the sheet cassette 111 in superposed relation between a pair of pressing rollers 121 of the pressure developing unit 120.

A second thermal fixing unit 130 heats the color developer sheet 112 to accelerate color development thereof and make the color developer sheet 112 glossy.

Operation of the picture image recording apparatus shown in FIG. 9 is as follows:

Based on image information from a host computer or the like, a first mask member 81 (corresponding to cyan, for example) is produced by the laser printer 70. The first mask member 81 is then fed into the mask member cassette 80. When the exposure unit 90 is detected as being in a condition capable of exposure, the first mask member 81 is delivered into the exposure position by the feed belt 91 and positioned with respect to the photosensitive pressure-sensitive recording sheet 92. Thereafter, the first fluorescent lamp 93R (which emits red light, for example) is energized and moved in the direction of the arrow C to expose the photosensitive pressure-sensitive recording sheet 92 to the first color emitted by the first mask member 81. After the photosensitive pressure-sensitive recording sheet 92 has been exposed to the first color, the first mask member 81 is released from the intimate contact with the photosensitive pressure-sensitive recording sheet 92 and discharged onto a discharge tray 94 by the feed belt 91.

While a latent image is being formed on the photosensitive pressure-sensitive recording sheet 92 by the first mask member 81, the laser printer 70 successively produces a second mask member 81 (corresponding to magenta, for example), and then a third mask member 81 (corresponding to yellow, for example). The second and third mask members 81 are successively stored into the cassette 80. After the latent image has been formed on the photosensitive pressure-sensitive recording sheet 92 by the first mask member 81, the second mask member 81 is fed from the cassette 80 into the exposure unit 90 in which the second fluorescent lamp 93G (which emits green light, for example) is energized to expose the photosensitive pressure-sensitive recording sheet 92 to the second mask member 81 in intimate contact therewith. Likewise, the photosensitive pressure-sensitive recording sheet 92 is subsequently exposed to the third mask member 81. As a result, latent images of three colors, i.e., a color latent image is formed on the photosensitive pressure-sensitive recording sheet 92.

Upon completion of the formation of the trichromatic latent image, the photosensitive pressure-sensitive recording sheet 92 is fed into the pressure developing unit 120 by the takeup roll 102 while being superposed on a color developer sheet 112 from the sheet cassette 111. In the pressure developing unit 120, those microcapsules which are not photo-set on the photosensitive pressure-sensitive recording sheet 92 are pressure-ruptured to allow dye precursors to be discharged and react with color developers on the color developer sheet 112 to develop and transfer a color image to the color developer sheet 112.

After the image development, the color developer sheet 112 is fed to the second thermal fixing unit 130 in which the image is thermally fixed, and then the color developer sheet 112 is discharged onto a discharge tray 131. The photosensitive pressure-sensitive recording sheet 92 that has been consumed by the image development is wound up by the takeup roll 102.

Mask members 81 for forming color images are stored in the casstete 80, and latent images are successively formed on the photosensitive pressure-sensitive sheet 92 by the mask members 81 from the cassette 90. For forming a monochromatic image with the laser printer 70 while forming a color image, the laser printer 70 and a color image forming system 60 are disconnected by a switch or the like, and the laser printer 70 is solely actuated to produce a monochromatic image on an intermediate sheet 61 which is then discharged onto a discharge tray 64.

According to the second embodiment of the present invention, since the mask member standby means is disposed between the mask member forming means and the exposure means, the speed of forming color picture images can be increased, and mask members with light-shielding images of separated colors can successively be formed while a color image is being produced. Moreover, the mask member forming means can singly be used as the laser printer. Therefore, operation efficiency of the picture image recording apparatus is highly increased.

A color picture image recording apparatus according to a third embodiment of the present invention will be described below with reference to FIGS. 10 through 13. In a color copying machine or recording apparatus, generally, image data of a color original with respect to different colors, i.e., red, green, and blue are read by an input device or reading mechanism, and a color image is reproduced based on the image data. For the sake of brevity, however, such an input device or reading mechanism is omitted from illustration in FIG. 10.

Figure 10:
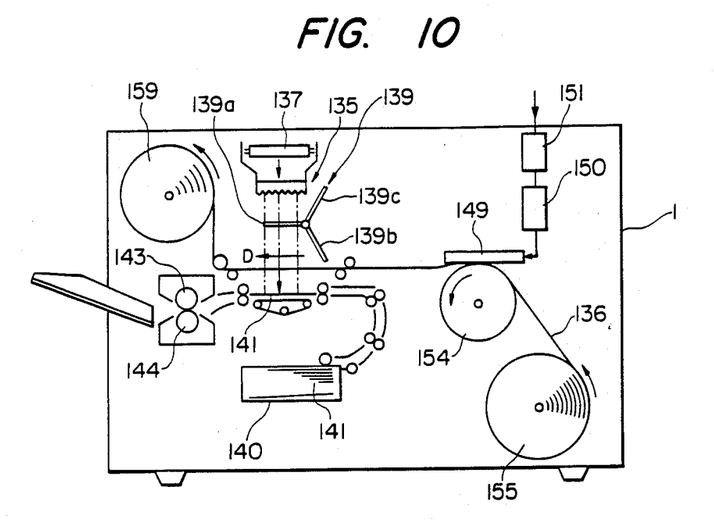
FIG. 10 is a schematic elevational view of a picture image recording apparatus according to a third embodiment of the present invention.

As shown in FIG. 10, red image data of different color data is applied via a data input unit 151 and a control unit 150 to a thermal head 149 which then records the red data on a thermosensitive recording sheet 136 in the form of a light-transmissive sheet sandwiched between the thermal head 149 and a platen 154 disposed in confronting relation to the thermal head 149. The thermosensitive recording sheet 136 is unreeled from a supply roll 155, fed between the platen 154, the thermal head 149, and a pressing roller 156 (FIG. 11), and delivered horizontally between a pair of feed rollers 157a, 157b, after which the thermosensitive recording sheet 136 is guided by a guide roller 158 and wound around a takeup roll 159. Then, green image data is recorded on the thermosensitive recording sheet 136 at a position which is spaced a certain pitch or distance from the area where the red image data has been recorded thereon. Similarly, blue image data is thereafter recorded on the thermosensitive recording sheet 136. In this manner, the three image data of red, green, and blue are separately recorded, each monochromatically, on the thermosensitive recording sheet 136, thus producing photomask plates or mask members. Thereafter, these mask members are fed in the direction of the arrow D (FIG. 10) and stopped when the first red mask member 137 is positioned directly below a light source 137 of an exposure device 135. A photosensitive pressure-sensitive recording sheet 141 coated with coloring materials of cyan, magenta, and yellow is fed from a sheet cassette 140 and positioned beneath the first red mask member so that the coated photosensitive layer of the sheet 141 faces the mask member. Then, the light source 137 is energized to emit light which is applied to the photosensitive pressure-sensitive recording sheet 141 through the first red mask member and a first filter 139a of a trichromatic color separation filter 139 of the exposure device 135, which only passes light having a wavelength of 350 nm that corresponds to the peak spectral sensitivity of cyan at 350 nm. Therefore, the exposed cyan microcapsules on the photosensitive pressure-sensitive recording sheet 141 are photo-set according to the corresponding latent image data thereon. Then, the thermosensitive recording sheet 136 is fed to the left by a predetermined pitch to locate the second green mask member directly above the photosensitive pressure-sensitive recording sheet 141. The color separation filter 139 is angularly moved to bring a second filter 139b which only passes light having a wavelength of 385 nm that corresponds to the peak spectral sensitivity of magenta at 385 nm, into the light path in the exposure device 135. Light from the light source 137 then passes through the second filter 139b and the second green mask member to photo-set the exposed magenta microcapsules on the photosensitive pressure-sensitive recording sheet 141 according to the corresponding latent image data thereon. Finally, light is applied to the photosensitive pressure-sensitive recording sheet 141 which is further fed along, through the third blue mask member and a third filter 139c which only passes light having a wavelength of 475 nm that corresponds to the peak spectral sensitivity of yellow at 475 nm, thereby to photo-set the exposed yellow microcapsules on the photosensitive pressure-sensitive recording sheet 141 according to the corresponding latent image data thereon. The single photosensitive pressure-sensitive recording sheet 141 is thus exposed to light successively through the three red, green, and blue mask members, whereupon the sheet 141 is fed between a pressure fixing roller 143 and an opposite roller 144, by which the sheet 141 is pressed. Those microcapsules which are not photo-set are therefore ruptured under pressure and mixed with color developers to produce colors, thereby reproducing a color image.

Figure 11:
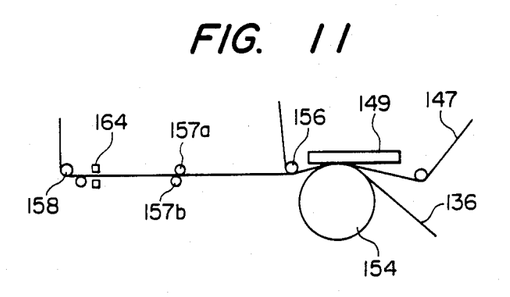
FIGS. 11 and 12 are schematic views explaining a mechanism for positioning a thermosensitive recording sheet in the picture image recording apparatus of the third embodiment.
Figure 12:
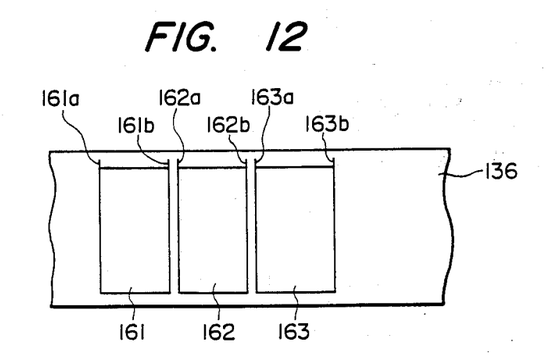

The thermosensitive recording sheet 136 used may comprise a thermosensitive recording sheet of paper which is employed in a fascimile receiver or the like, or a thermosensitive recording film. It is highly important to position the three mask members on the thermosensitive recording sheet 136 accurately with respect to the photosensitive pressure-sensitive recording sheet 141. As shown in FIGS. 11 and 12, the positions of the mask members are successively determined by marking starting lines 161a, 162a, 163a for image data frames 161, 162, 163 for red, green, and blue, respectively, on the thermosensitive recording sheet 136 with the thermal head 149, and sensing the starting lines 161a, 162a, 163a with a photosensor 164.

Figure 13:
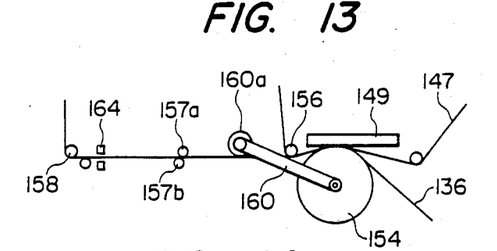
FIG. 13 is a schematic view of a modification of the third embodiment.

FIG. 13 shows a modification of the third embodiment shown in FIG. 10. According to this modification, a tension arm 160 is angularly movably supported coaxially on the platen 154. The tension arm 160 has a pair of rollers 160a on its distal end which engage transverse edges of the thermosensitive recording sheet 136 due to the gravity of the tension arm 160 and the rollers 160a for giving constant tension to the thermosensitive recording sheet 136 between the pressing roller 156 and the feed rollers 157a, 157b. By stopping the feed rollers 157a, 157b while the thermosensitive recording sheet 136 is being fed toward the exposure device 135 by the platen 154 and the pressing roller 156, the thermosensitive recording sheet 136 is caused to depend with the tension arm 160 between the pressing roller 156 and the feed rollers 157a, 157b. Therefore, during exposure of the thermosensitive recording sheet 136 in the exposure device 135, mask members bearing light-shielding images of respective separated colors can successively be produced.

With the third embodiment of the present invention, mask members of respective image data are produced by the thermal head based on the image data supplied from the original, and the photosensitive pressure-sensitive recording sheet is exposed to light through the mask members. The colors can be reproduced well and clearly irrespective of whether a colored or monochromatic image is copied. The picture image recording apparatus does not require periodic maintenance or examination as is the case with the electrophotographic process, and is less expensive than conventional picture image recording apparatus since the apparatus of the invention is not complex in structure. The apparatus of the invention is further advantageous in that it has a lower electric power requirement than electrophotographic copying apparatus which employs a thermal fixing device, and can be maintained or serviced with ease.

Figure 14:
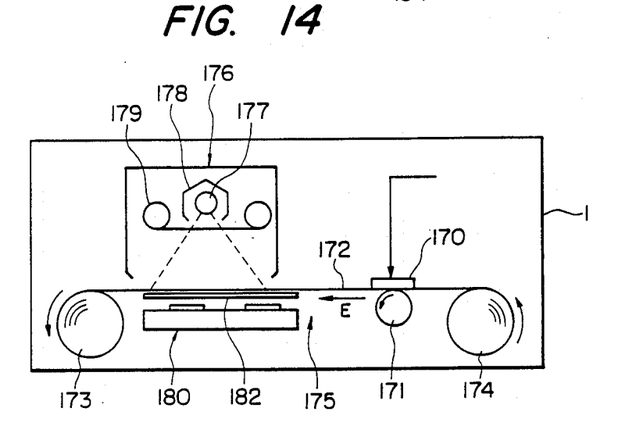
FIG. 14 is a schematic elevational view of a picture image recording apparatus according to a fourth embodiment of the present invention.

A color picture image recording apparatus according to a fourth embodiment will hereinafter be described with reference to FIGS. 14 through 17. As illustrated in FIG. 14, the color picture image recording apparatus comprises a thermal head 170, a platen 171, a feeding unit 175 for feeding a mask member, an exposure unit 176, a supply unit 180 for supplying a photosensitive pressure-sensitive sheet, and a pressure fixing unit 185.

The thermal head 170 comprises a linear print head. A thermosensitive sheet 172 is pressed against the thermal head 170 by the platen 171 disposed in confronting relation to the thermal head 170. The thermal head 170 records an image on the thermosensitive sheet 172 based on desired image information. At this time, the platen 172 is not continuously driven to rotate about its own axis.

The mask member feeding unit 175 comprises a takeup roll 173 for winding the thermosensitive recording sheet 172, a supply roll 174 for supplying the thermosensitive recording sheet 172, and a motor (not shown) for rotating the takeup roll 173 and stopping the thermosensitive recording sheet 172 in a prescribed position. The thermosensitive recording sheet 172 may comprise a thermosensitive recording sheet of paper which finds use in a facsimile receiver or the like, or a thermosensitive recording film. In any case, the thermosensitive recording sheet 172 should be soft, have a thickness ranging from 50 to 200 micrometers, and be capable of passing light therethrough which has a wavelength longer than the wavelength $\lambda = 350$ nm.

Figure 15:
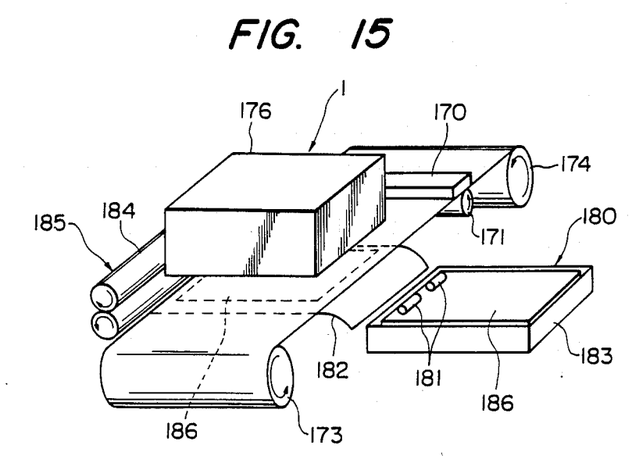
FIG. 15 is a perspective view of a feeder for a photosensitive pressure-sensitive sheet and a feeder for a thermosensitive recording sheet in the fourth embodiment.

As shown in FIG. 15, the supply unit 180 comprises a sheet cassette 183 for storing photosensitive pressure-sensitive sheets 186, feed rollers 181 for feeding one photosensitive pressure-sensitive sheet 186, at a time, from the sheet cassette 183, and a sheet guide 182 for guiding the sheet fed by the feed rollers 181. The sheet guide 182 is disposed underneath the photosensitive pressure-sensitive sheet 186 so that the photosensitive pressure-sensitive sheet 186 can be positioned directly below the thermosensitive recording sheet 172 in an exposure position or station, and will be guided between a pair of pressing rollers 184.

The direction in which the photosensitive pressure-sensitive sheet 186 is fed and the direction in which the thermosensitive recording sheet 172 is fed are different from each other (perpendicular to each other in FIG. 15). Therefore, the feed rollers 181 and the pressing rollers 184 are positioned out of alignment with or laterally of the thermosensitive recording sheet 172. As a result, the color picture image recording apparatus is small in size.

Figure 17:
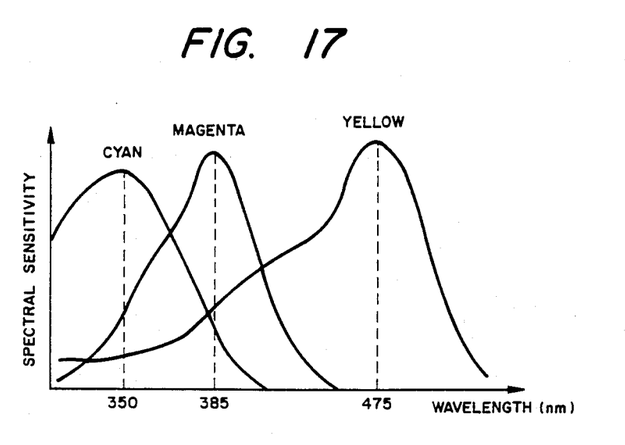
FIG. 17 is a diagram showing spectral sensitivities of a photosensitive pressure-sensitive sheet.

The photosensitive pressure-sensitive sheet 186 is capable of reproducing color images, and is coated with microcapsules containing coloring agents of basic colors of cyan, magenta, and yellow. The photosensitive pressure-sensitive sheet 186 has spectral sensitivities as shown in FIG. 17. Specifically, the spectral sensitivities include a peak sensitivity for cyan at the wavelength $\lambda = 350$ nm, a peak sensitivity for magenta at the wavelength $\lambda = 385$ nm, and a peak sensitivity for yellow at the wavelength $\lambda = 470$ nm.

Figure 16:
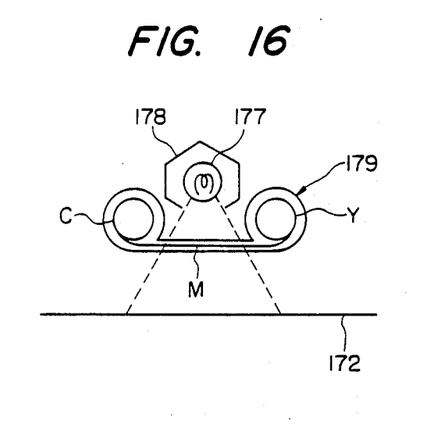
FIG. 16 is a schematic cross-sectional view of an exposure device.

The exposure unit 176 comprises an exposure light source lamp 177, a reflector 178 for directing light emitted from the exposure lamp 177 toward the thermosensitive recording sheet 172, and a filter unit 179 including interference filters for passing lights of wavelengths corresponding to the basic colors, respectively, to selectively photo-set the coloring materials of cyan, magenta, and yellow on the photosensitive pressure-sensitive sheet 186.

For recording an image of a certain color on the photosensitive pressure-sensitive sheet 186, the filter unit 179 selects one of cyan, magenta, and yellow filters C, M, Y through a suitable means. The exposure lamp 177 should preferably emit light having a wide wavelength range extending from an ultraviolet range at about $\lambda = 300$ nm to a visible light range. One example of such an exposure lamp is a xenon lamp.

The pressure fixing unit 185 serves to rupture those microcapsules which have not been exposed to light, i.e., photo-set, and also to record an image on the sheet 186 with the dyes discharged out of the ruptured microcapsules. The pressure fixing unit 185 comprises the pair of pressing rollers 184 and a sheet feed member (not shown).

The color picture image recording apparatus of the fourth embodiment operates as follows:

First, a magenta image is formed on the photosensitive pressure-sensitive sheet 186. More specifically, an image signal indicative of a magenta image is applied to the thermal head 170 to blacken an area of the thermosensitive recording sheet 172 which should finally be of magenta. The thermosensitive recording sheet 172 with the blackened area serves as a magenta positive mask member, and is superposed on the photosensitive pressure-sensitive sheet 186 for exposure to light emitted from the exposure lamp 177. At this time, the magenta interference filter M of the filter unit 179 is positioned in the light path for passing only light having a wavelength $\lambda = 385$ nm. The exposed magenta microcapsules on the sheet 186 are therefore photo-set. Those magenta microcapsules which are not exposed to the light having a wavelength $\lambda = 385$ nm because of the blackened area on the thermosensitive recording sheet 172 are not photo-set, and will be ruptured to develop color when pressed by the pressing rollers 184, thereby forming a magenta image on the sheet 186.

Yellow and cyan images are formed in the similar manner. The yellow and cyan filters Y, C of the filter unit 179 are successively placed in the light path. The thermal head 170 successively forms yellow and cyan positive mask members on the thermosensitive recording sheet 172. The exposure lamp 177 emits light to which the sheet 186 is exposed respectively through the yellow and cyan positive mask members. The yellow and cyan microcapsules are selectively photo-set and ruptured to form yellow and cyan images on the sheet 186. During exposure of the photosensitive pressure-sensitive sheet 186 to light, the thermosensitive sheet 172 is held at rest. Before this, the photosensitive pressure-sensitive sheet 186 is fed from the sheet cassette 183 to the exposure station by the feed rollers 181 and the sheet guide 182 in a direction normal to the direction in which the thermosensitive recording sheet 172 is fed. In the exposure station, the sheet 186 is held in lightly intimate contact with the thermosensitive recording sheet 172 by a pressure plate (not shown).

For exposing the photosensitive pressure-sensitive sheet 186 to the three primaries, i.e., cyan, magenta, and yellow in superposed relation, the photosensitive pressure-sensitive sheet 186 is held at rest, and the positive mask members of the respective colors on the thermosensitive recording sheet 172 are successively moved in the direction of the arrow E and stopped in the exposure position or station where the sheet 186 is exposed to light for the respective colors in succession.

After the sheet 186 has been exposed, it is passed through the pressing rollers 184, and the microcapsules which have not been photo-set are ruptured to develop colors with the discharged coloring agents.

After the blackened areas on the thermosensitive recording sheet 172 have been used as the mask members, the sheet 172 is also moved in the direction of the arrow E and coiled around the takeup roll 173. When the thermosensitive recording sheet 172 on the supply roller 174 is used up, the supply roller 174 is replaced with a new roll of thermosensitive recording sheet 172 on a supply roller 174. In the fourth embodiment, since a colored image is formed by monochromatic mask members that have been recorded on the thermosensitive recording sheet 172 by the thermal head 170, it is not necessary to deliver a trichromatic ink ribbon back and forth as is the case with conventional thermal color printers. The color picture image recording apparatus of the fourth embodiment is simpler in structure, smaller in size, less costly to manufacture, and higher in reliability than conventional xerogrpahic color printers.

In each of the aforesaid embodiments, the present invention has been described as being embodied in a color printer. However, the present invention is also applicable to a monochromatic printer insofar as a photosensitive pressure-sensitive sheet coated with microcapsules containing a coloring agent of black, yellow, magenta, or cyan.

The xenon lamp used as the exposure lamp 177 may be replaced with fluorescent lamps capable of emitting lights having respective wavelengths of 350, 385, and 470 nm.

The thermal head may be replaced with an electrically energizable print head, an ink jet print head, an impact dot-matrix print head, or the like.

With the color picture image recording apparatus according to the fourth embodiment, mask members are produced on the thermosensitive recording sheet based on image information to be duplicated, and the photosensitive pressure-sensitive recording sheet is exposed to light through the mask members. The colors can be reproduced well and clearly irrespective of whether a colored or monochromatic image is copied. Since the direction in which the photosensitive pressure-sensitive sheet is fed and the direction in which the thermosensitive recording sheet is fed are different from each other, the feed rollers for feeding the thermosensitive recording sheet and the feed rollers for feeding the photosensitive pressure-sensitive sheet are not superposed on each other. As a result, the color picture image recording apparatus is small in size.

The picture image recording apparatus does not require periodic maintenance or examination as is the case with the electrophotographic process, and is less expensive than conventional picture image recording apparatus since the apparatus of the invention is not complex in structure. The apparatus of the invention can be maintained or serviced with ease. Accordingly, the color picture image recording apparatus according to the present invention is of many industrial merits.

Although certain preferred embodiments have been shown and described, it should be understood that many changes and modifications may be made therein without departing from the scope of the appended claims.

What is claimed is:

1. An image recording apparatus for recording an image corresponding to an original on a developing medium with the use of a light-transmissive sheet and a photosensitive recording medium, said apparatus comprising:

image-forming means for sequentially forming each of a plurality of light-shielding images on said light-transmissive sheet movable in a predetermined direction;

exposing means disposed downstream of said image-forming means relative to the movement of said light-transmissive sheet for exposing said photosensitive recording medium to light through said light-transmissive sheet to form on said photosensitive recording medium a latent image corresponding to said light-shielding image;

accumulating means disposed between said image-forming means and said exposing means for accumulating said light-transmissive sheet carrying said light shielding image thereon;

developing means disposed downstream of said exposing means for developing said latent image on said photosensitive recording medium into a visible image on said developing medium, said developing medium being held in superposed relation with said photosensitive recording medium; and control means for controlling said image-forming means and said accumulating means to form a subsequent light-shielding image on a light-transmissive sheet during exposure of a photosensitive recording medium through a previous light-shielding image on a light-transmissive sheet and holding the light-transmissive sheet carrying said subsequent light-shielding image in a standby condition at said accumulating means to prevent said sheet from being fed into said exposing means during the exposure through said previous light-shielding image.

2. An image recording apparatus according to claim 1, wherein said image-forming means comprises a wire dot printer.

3. An image recording apparatus according to claim 1, wherein said image-forming means comprises a laser printer.

4. An image recording apparatus according to claim 1, wherein said image-forming means comprises a thermal head.

5. An image recording apparatus according to claim 1, wherein said light-transmissive sheet comprises a continuous elongate sheet.

6. An image recording apparatus according to claim 1, wherein said light-transmissive sheet comprises a rectangular sheet cut to a predetermined dimension.

7. An image recording apparatus according to claim 5, wherein said light-transmissive continuous elongate sheet is directed in a first direction toward said exposing means during an inoperable state of said accumulating means, and wherein said accumulating means comprises means for urging said light-transmissive continuous elongate sheet in a second direction offset from said first direction for positively storing, under tension, said sheet carrying said subsequent light-shielding image to provide said standby condition.

8. An image recording apparatus according to claim 6, wherein said accumulating means comprises an accommodating member for storing a plurality of said light-transmissive cut sheets each carrying said light-shielding image.

9. An image recording apparatus according to claim 1, wherein said photosensitive recording medium comprises a photosensitive material and a dye precursor of a color selected from the group of colors consisting of cyan, magenta and yellow, said photosensitive material and said dye precursor being encapsulated in pressure-rupturable microcapsules having a mechanical strength variable when exposed to light.

10. An image recording apparatus according to claim 1, further comprising an input device for entering color image data from an original into said image-forming means.

11. An image recording apparatus according to claim 1, further comprising feeding means for feeding said photosensitive recording medium in a transverse direction relative to said movement direction of said light-transmissive sheet.

* * * * *